United States Patent [19]

Smarandoiu et al.

[11] Patent Number: 4,489,401
[45] Date of Patent: Dec. 18, 1984

[54] ELECTRICAL PARTITIONING SCHEME FOR IMPROVING YIELDS DURING THE MANUFACTURE OF SEMICONDUCTOR MEMORY ARRAYS

[75] Inventors: George Smarandoiu, Palo Alto; George Perlegos, Fremont, both of Calif.

[73] Assignee: Seeq Technology, Inc., San Jose, Calif.

[21] Appl. No.: 367,332

[22] Filed: Apr. 12, 1982

[51] Int. Cl.³ .............................................. G11C 11/40
[52] U.S. Cl. ................................................. 365/200
[58] Field of Search ....................... 365/200, 210, 230; 371/10

[56] References Cited

U.S. PATENT DOCUMENTS 4,250,570  2/1981  Tsang et al. ......................... 365/200

Primary Examiner—Joseph A. Popek
Attorney, Agent, or Firm—Lyon & Lyon

[57] ABSTRACT

Circuitry for isolating and rendering inoperative faulty storage devices in a semiconductor memory array is disclosed. A determination is made as to whether the x-addresses of the faulty storage devices contain an address bit having a common value for all of the faulty storage devices. If such an address bit exists, the address buffer associated with the common address bit is programmed to lock in a permanent set of address indicator outputs. All x-address locations accessed by address signals containing the common address bit are thereafter disabled. The memory array continues to function at half its former storage capacity, using the storage devices associated with the remaining address locations.

12 Claims, 3 Drawing Figures

ELECTRICAL PARTITIONING SCHEME FOR IMPROVING YIELDS DURING THE MANUFACTURE OF SEMICONDUCTOR MEMORY ARRAYS

TECHNICAL FIELD

The present invention is directed to a means for increasing yields during the manufacture of semiconductor memory arrays and more particularly concerns a circuit which operates to electrically partition a semiconductor memory array in order to isolate and render inoperative faulty sections of the array.

BACKGROUND ART

The use of MOS floating gate storage devices in semiconductor memories has increased rapidly in recent years. A typical MOS floating gate storage device includes a floating gate structure disposed over the surface of a semiconductor substrate between spaced-apart source and drain regions. A control gate is then vertically aligned with the floating gate. Programming of the storage device is carried out by applying a potential to the control gate such that charge carriers are transported between the semiconductor substrate and the floating gate, whereupon the threshold voltage in the channel region established between the spaced-apart source and drain regions is modified. During read operations, the presence or absence of charge carriers on the floating gate can be determined by simply measuring the presence or absence of current flow through the channel region in response to voltage potentials applied to the drain region. When floating gate storage devices of the type described above are incorporated in a semiconductor memory array, individual floating gates are utilized for each storage device while a single conductive strip is generally etched to define the control gates for all of the storage devices in a single memory array row. This single conductive strip is commonly known as a word line. The memory array is prepared for programming or read operations by enabling the word line of a particular memory array row using a unique x-address applied to the address inputs of the memory array.

During manufacture of the memory array, defects in various storage devices positioned along one or more rows in the memory array may occur, giving rise to erroneous data read-outs when the word line connected to the defective storage devices is addressed. In order to salvage memory arrays having such faulty word lines, semiconductor manufacturers often construct memory arrays with several additional or redundant rows of storage devices, each redundant row being tied to a redundant word line. If a faulty word line is located during quality control examination of the memory array, the x-address of the faulty word line is programmed into an enabling circuit for one of the redundant word lines. Thereafter, whenever the faulty word line is addressed, the redundant word line will instead be enabled.

It can thus be seen that the presence of redundant word lines in a semiconductor memory array significantly increases the manufacturing yield from any batch of memory arrays undergoing simultaneous construction. Despite the increased manufacturing yields attainable with redundant row techniques, however, economic and engineering constraints dictate a finite limit on the number of redundant word lines which can practically be provided for any given memory array. Hence, a distinct possibility exists that the number of defective storage devices in a given memory array will exceed the back-up memory capacity of that array, i.e., the possibility exists that the number of faulty word lines in the array will be greater than the number of redundant word lines associated with the array. In the latter event, of course, the array is rendered useless unless some additional means for programming the faulty word lines out of the array can be found.

DISCLOSURE OF THE INVENTION

It is accordingly the object of the present invention to provide a means for increasing yields during the manufacture of semiconductor memory arrays.

It is an additional object of the present invention to provide a peripheral circuit structure which may be activated to electrically isolate sections of a semiconductor memory array containing defective storage devices, thereby disabling the defective storage devices and effectively removing them from the array.

It is yet another object of the present invention to provide a peripheral circuit structure for a semiconductor memory array, the peripheral circuit structure operating to permanently disable all memory array storage devices having addresses characterized by at least one common address bit.

These and other objects of the present invention are achieved in a semiconductor memory array having a series of n address buffers respectively connected to receive n address bits of an address signal. Normally, the outputs from each address buffer assume one of two buffer output states depending upon whether the associated address bit input is a binary one or a binary zero. The various buffer output states determine which of the individual storage devices comprising the semiconductor memory array will be accessed or addressed for reading or programming purposes. Although the address buffers generally perform their addressing functions in conventional fashion, a selected one of the memory array address buffers includes an additional circuit which can be programmed to permanently lock the outputs of the selected address buffer into either one of the two buffer output states regardless of the value of the address bit input to the selected address buffer. Thus, it is possible to isolate and effectively disable every memory array storage device addressed by an address signal having a characteristic one of two possible values for the address bit input to the selected address buffer while leaving operable every memory array storage device addressed by an address signal having the remaining complementary value for the address bit input to the selected address buffer. In this manner, a memory array formed with large numbers of defective storage devices addressable by address signals having at least one address bit value in common can be electrically partitioned to remove the defective storage devices from the array. The resulting semiconductor structure, which has a memory capacity equal to exactly one-half that of the original array, may then be salvaged and utilized with address signals having $n-1$ address bits.

BRIEF DESCRIPTION OF THE DRAWINGS

The various features, objects and advantages of the present invention will become more apparent upon consideration of the following Brief Description of the Drawings and Best Mode for Carrying Out the Invention, wherein.

BEST MODE FOR CARRYING OUT THE INVENTION

Figure 1:
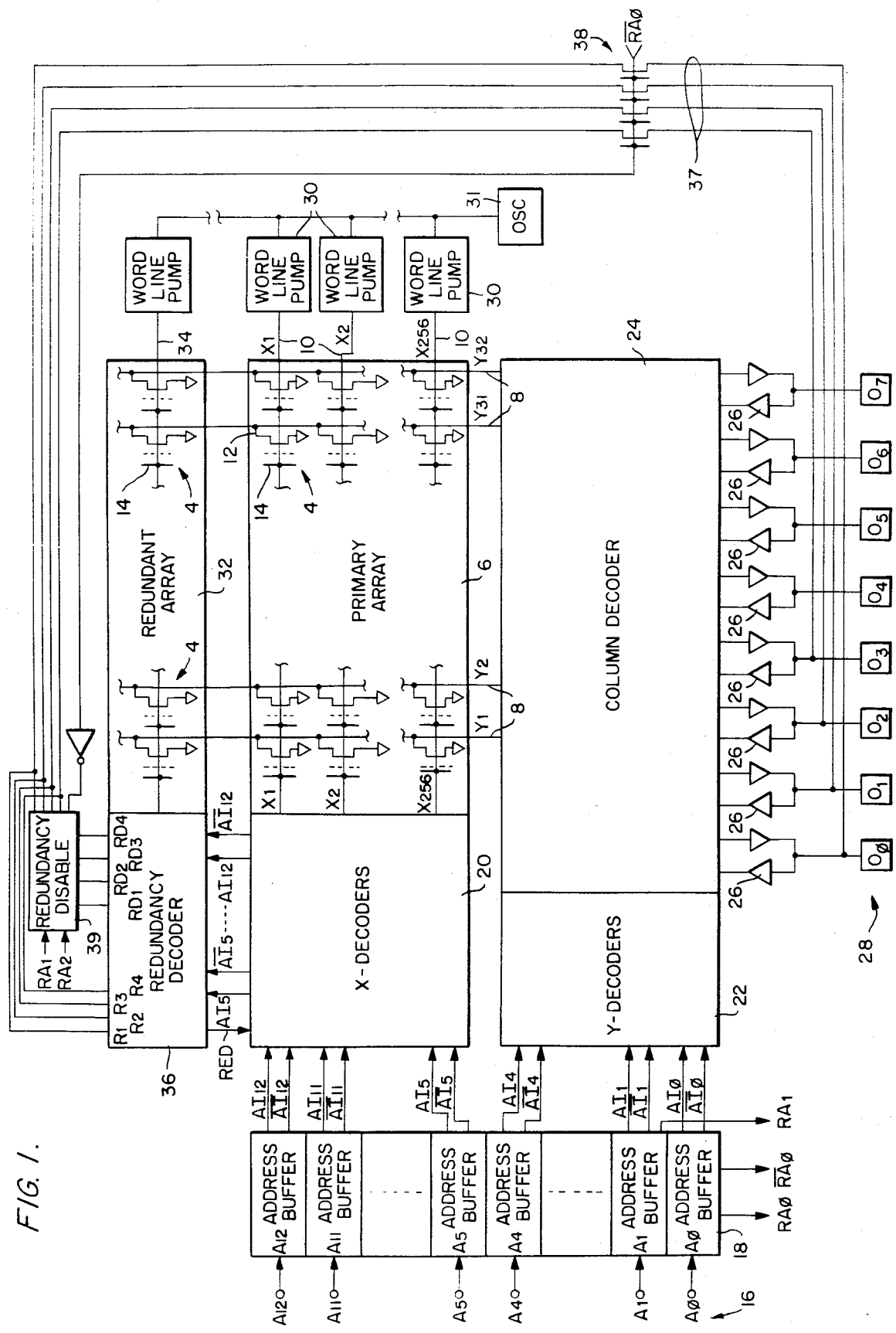
FIG. 1 is a schematic representation of a semiconductor memory comprising floating gate storage devices arranged along primary and redundant word lines to form primary and redundant arrays.

FIG. 1 schematically illustrates a semiconductor memory having a plurality of MOS storage devices 4 arranged to form a primary array 6. Each of the storage devices 4 may comprise an electrically-programmable read-only floating gate structure of the type disclosed in U.S. Pat. No. 4,075,045. A series of bit lines 8 arranged in columns and primary word lines 10 arranged in rows are respectively connected to the storage device drains 12 and control gates 14, whereby each storage device may be individually programmed and read in accordance with a unique storage device address. Specifically, primary word lines 10 serve to define the x-addresses of the storage devices while bit lines 8 serve to define the storage device y-addresses. Thus, in a 64k-bit embodiment, memory 2 includes two hundred and fifty-six primary word lines designated $X_1, X_2 \ldots X_{256}$ and two hundred and fifty-six bit lines designated $Y_1, Y_2 \ldots Y_{256}$. If desired, the bit lines can be subdivided into eight groups of 32 bit lines each to enable the simultaneous storage of an 8-data bit word, i.e., a data byte, using only a single y-address. In the latter event, each of the eight bit lines activated by the single y-address may be arranged in interleaved fashion.

Programming or reading of a particular storage device, or set of storage devices where bit lines 8 are divided into interleaved groups, is initiated by applying a digital address signal $A_0, A_1 \ldots A_n$ to a series of address bit inputs 16. In the interleaved 64k-bit embodiment of memory 2 described above, the first five address bits $A_0-A_4$ establish the particular y-address $Y_1, Y_2 \ldots Y_{32}$ of each data byte while an additional eight address bits $A_5-A_{12}$ establish the data byte x-address $X_1, X_2 \ldots X_{256}$. Address bit inputs 16 respectively feed the address bits $A_0-A_{12}$ to a series of address buffers 18. Each of the address buffers in turn generates an address indicator $AI_i$ and an inverted address indicator $\overline{AI_i}$ for use in decoding the address signal. That is, the output of the address buffers 18 which receive address bits $A_0-A_4$ comprise a series of address indicators $AI_0-AI_4$ and inverted address indicators $\overline{AI_0}-\overline{AI_4}$, whereas the output of the address buffers 18 which receive address bits $A_5-A_{12}$ comprise a series of address indicators $AI_5-AI_{12}$ and inverted address indicators $\overline{AI_5}-\overline{AI_{12}}$. Address indicators $AI_5-AI_{12}$ and inverted address indicators $\overline{AI_5}-\overline{AI_{12}}$ are supplied to X-decoders schematically illustrated at 20 and are combined in a digital logic system to enable the specific primary word line 10 associated with the x-address established by address bits $A_5-A_{12}$. Simultaneously, the address indicators $AI_0-AI_4$ and inverted address indicators $\overline{AI_0}-\overline{AI_4}$ are supplied to Y-decoders illustrated schematically at 22. The Y-decoders operate in conjunction with a column decoder 24, combining the various address and inverted address indicators in a digital logic system such that selected bit lines 8 associated with the y-address established by data bits $A_0-A_4$ are enabled.

Data is programmed into or read out of primary array 6 by connecting each enabled bit line 8 to the appropriate one of a pair of input/output buffers 26 respectively tied to output pads 28 and then entering or reading out the appropriate data bit $O_0-O_7$. As further disclosed in co-pending U.S. patent application Ser. No. 346,159 filed Feb. 5, 1982 and incorporated herein by reference, the time required to program individual storage devices 4 in primary array 6 can be significantly reduced by increasing the programming voltage present on the primary word lines 10 associated with the individual storage devices 4. To this end, a series of word line charge pumps 30 driven by a high voltage oscillator 31 are respectively connected to primary word lines 10 in order to raise the voltages thereof to a predetermined level during memory programming operations.

Memory 2 is additionally provided with a redundant array 32 of storage devices 4 arranged along redundant word lines 34 for the purpose of providing back-up memory capacity should any of the primary word lines 10 in primary array 6 prove faulty, i.e., should any of the storage devices 4 associated with primary word lines 10 contain manufacturing defects. The redundant word lines 34 are connected to the control gates 14 of storage devices 4 to establish alternate x-addresses for the memory. When a faulty word line is present at a particular x-address in primary array 6, address indicators $AI_5-AI_{12}$ and inverted address indicators $\overline{AI_5}-\overline{AI_{12}}$ generated by address buffers 18 as a function of the address bits $A_5-A_{12}$ corresponding to the x-address of the faulty primary word line are used to program a redundancy decoder 36 such that any subsequent address signal $A_0-A_{12}$ having the x-address of the faulty word line in primary array 6 will instead enable a selected redundant word line 34 in redundant array 32. A series of control signals supplied to redundancy select lines 37 via the output pads 28 associated with data bits $O_0-O_3$ are gated through a set of redundancy enable transistors 38 to assist in programming redundancy decoder 36. Once a particular x-address has been transferred from primary array 6 to redundant array 32, a redundancy disable circuit 39 prevents any accidental reprogramming of redundancy decoder 36 relative to the selected redundant word line 34 enabled by the particular x-address. The redundancy disable circuit additionally generates a redundancy disable signal $RD_1-RD_4$ indicative of the fact that the selected redundant word line is in use, which redundancy disable signal can be supplied back through redundancy enable transistors 38 to an appropriate output pad 28. A more detailed explanation of the structure and function of redundant array 32, redundancy decoder 36 and redundancy disable circuit 39 can be found in co-pending U.S. patent application Ser. No. 367,331, filed Apr. 12, 1982 and also incorporated herein by reference.

Figure 2:
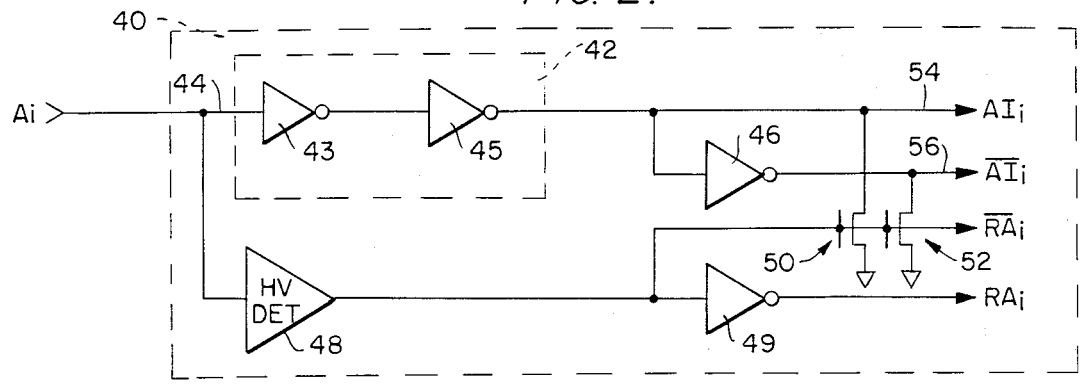
FIG. 2 is a circuit diagram of a dual-function address buffer capable of generating control signals for use in the redundancy decoder and redundancy disable circuit of the present invention.

The address buffers 18 employed in the memory 2 of the present invention may be constructed with a dual function capability, providing control signals for governing the operation of various peripheral circuits of the memory in addition to the aforementioned address and inverted address indicators $AI_0-AI_{12}$, $\overline{AI_0}-\overline{AI_{12}}$. Turning to FIG. 2, a representative address buffer 40 can be seen, it being understood that all of the address buffers 18 of FIG. 1 are similarly constructed. Address buffer 40 includes a conventional buffer/amplifier circuit 42 comprising series-connected inverters 43 and 45 which receive an incoming address bit $A_i$ via input lead 44 and output an address indicator $AI_i$ in response thereto. The address indicator $AI_i$ switches either high or low depending upon whether address bit $A_i$ is a binary zero or a binary one. An inverter 46 connected to the output of buffer/amplifier circuit 42 provides the inverted address indicator $\overline{AI}_i$. The value of inverted address indicator $\overline{AI}_i$ is, of course, low whenever the value of address indicator $AI_i$ is high and vice versa. Address buffer 40 further includes a high voltage detector 48 which detects high voltage inputs to the address buffer, i.e., voltages significantly greater than the TTL voltages employed in conjunction with address bits $A_i$. The high voltage detector output comprises an inverted control signal $\overline{RA}_i$ which may be used for control purposes by other peripheral circuits in memory 2. Inverted control signal $\overline{RA}_i$ is passed through an inverter 49 to produce control signal $RA_i$, and is simultaneously supplied to the control gates of pull-down transistors 50, 52 respectively connected across address indicator and inverted address indicator leads 54, 56. The address buffer of the present invention thus operates in two modes. When normal TTL voltages in the form of $A_i$ address bits are present on input lead 44, address buffer 40 outputs an address indicator $AI_i$ and an inverted address indicator $\overline{AI}_i$ having complementary values determined in accordance with the binary state of address bit $A_i$. When, however, a high voltage (e.g., 15 v) signal is applied to the input lead 44, the inverted control signal $\overline{RA}_i$ from high voltage detector 48 switches high to perform the aforementioned peripheral control functions, the control signal $RA_i$ from inverter 49 switches low to perform additional peripheral control functions and pull-down transistors 50 and 52 are gated into conduction by inverted control signal $\overline{RA}_i$ to disable the address and inverted address indicators $AI_i$, $\overline{AI}_i$.

As previously indicated, the number of defective storage devices present in primary array 6 may outstrip the back-up memory capacity furnished by redundant array 30. Memory 2 can nevertheless be salvaged if a sufficient number of the defective storage devices all have addresses with at least one address bit in common. If the latter condition is met, the portion of primary array 6 addressed by the common address bit can be electrically partitioned or isolated from the remainder of primary array 6 to disable the defective storage devices and, in effect, remove them from the array. Electrical partitioning of primary array 6 is accomplished by tying the outputs of a selected address buffer into either of two permanent states depending upon the addresses of the portion of the array to be isolated. That is, where all primary array storage devices 4 containing manufacturing defects can be characterized by addresses having a "one" value for the address bit $A_k$ associated with the selected address buffer, the selected address buffer is programmed to permanently output a low address indicator $AI_k$ and a high inverted address indicator $\overline{AI}_k$. Thereafter, regardless of the status of the remaining address bits $A_0 \ldots A_{k-1}, A_{k+1} \ldots A_n$, all primary array storage devices including the defective storage devices addressed by an address signal having a "one" value for the $A_k$ address bit input to the selected address buffer will be effectively disabled. Similarly, where the addresses of all the defective storage devices in primary array 6 are characterized by a "zero" value for the $A_k$ address bit input to the selected address buffer, the selected address buffer is programmed to permanently output a high address indicator $AI_k$ and a low inverted address indicator $\overline{AI}_k$. Again it can be seen that all of the primary array storage devices, including the defective storage devices, otherwise addressed by an address signal having a value of "zero" for the $A_k$ address bit input to the selected address buffer will remain inactive regardless of the status of the remaining address bits $A_0 \ldots A_{k-1}, A_{k+1} \ldots A_n$.

In the 64k-bit embodiment of memory 2, the $A_{12}$ address buffer is arbitrarily selected for implementing the partitioning scheme of the present invention, although it is understood that other address buffers in memory 2 could be employed for this purpose as well. It is therefore evident that the $A_{12}$ address bit associated with all or substantially all of the defective storage devices present in primary array 6 must be identical in order to justify partitioning of the array. Utilization of the $A_{12}$ address buffer for partitioning effectively removes the $A_{12}$ address bit from the digital address signal supplied to address bit inputs 16, in the process creating a 32k-bit memory configuration. One hundred and twenty-eight of the two hundred and fifty-six word lines 10 in primary array 6 are thus rendered inoperative while the remaining one hundred and twenty-eight word lines 10 in the primary array can still be enabled by supplying a digital address signal $A_0$–$A_{11}$ to address buffers 18. The partitioning of primary array 6, of course, does not affect redundant array 32 and redundant word lines 34 can be programmed as taught in the aforementioned U.S. patent application Ser. No. 367,331 to replace additional faulty word lines 10 located in the remaining operable one hundred and twenty-eight word lines of primary array 6.

Figure 3:
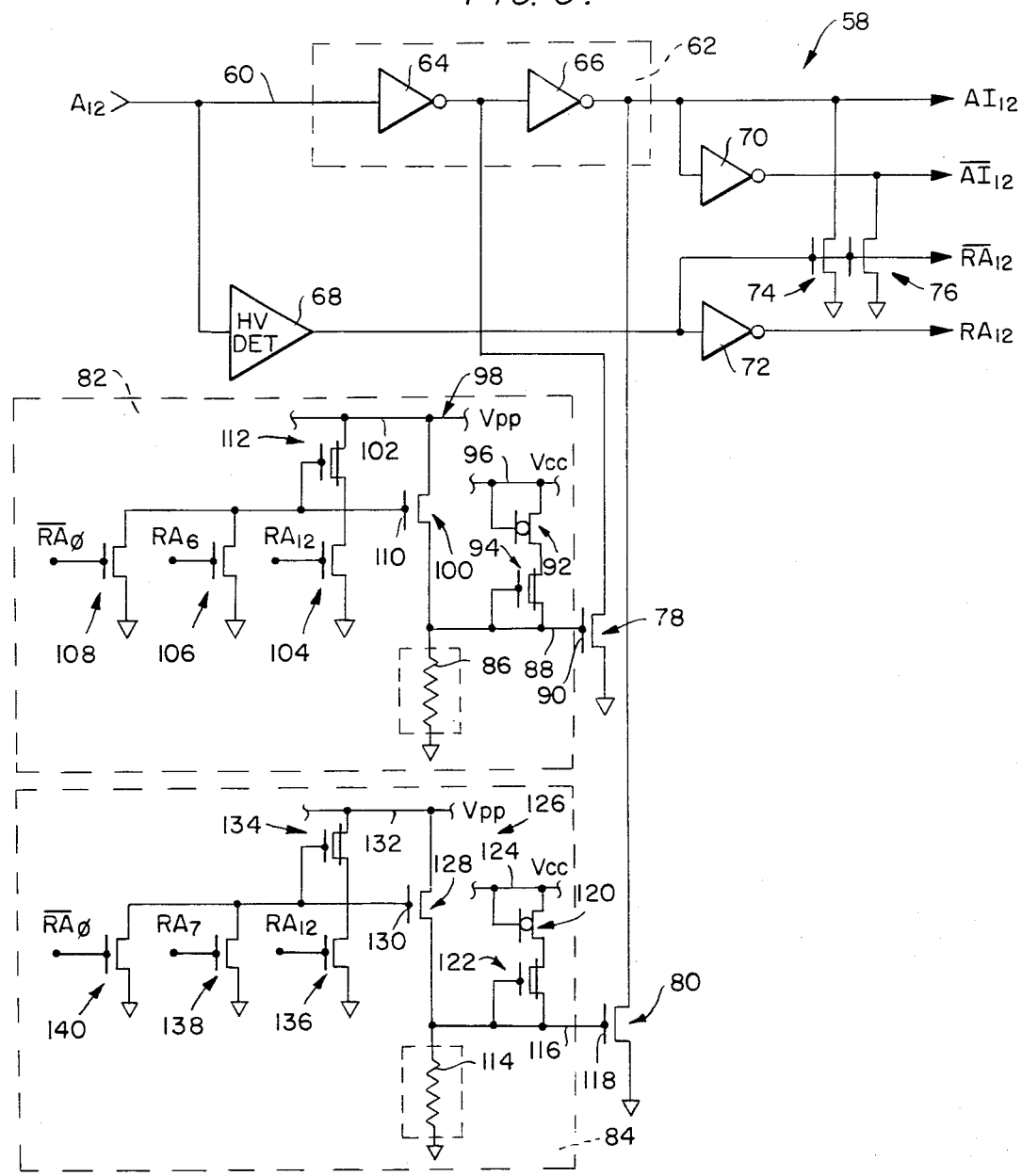
FIG. 3 illustrates a modified version of the address buffer disclosed in FIG. 2, which modified version includes circuitry for locking the address buffer outputs into one of two permanent states regardless of the value of the address bit input associated therewith.

FIG. 3 illustrates the circuitry necessary to modify the output from the $A_{12}$ address buffer 58 during the partitioning of primary array 6. Address buffer 58 is similar in construction to the representative address buffer 40 of FIG. 2, and includes an input lead 60, a buffer/amplifier circuit 62 comprising series-connected inverters 64 and 66, a high voltage detector 68 and inverters 70 and 72 arranged as heretofore described in connection with FIG. 2 to generate the address indicator $AI_{12}$, the inverted address indicator $\overline{AI}_{12}$, control signal $RA_{12}$ and inverted control signal $\overline{RA}_{12}$. Pull-down transistors 74 and 76 again function to disable the address and inverted address indicators $AI_{12}$, $\overline{AI}_{12}$ when inverted control signal $\overline{RA}_{12}$ switches high following the application of a high voltage signal to input lead 60. In order to carry out the array partitioning operation, address buffer 58 additionally includes a pair of enhancement-mode pull-down transistors 78 and 80 respectively connected to the outputs of inverters 64 and 66 for use in permanently programming the address and inverted address indicators $AI_{12}$, $\overline{AI}_{12}$ output from the $A_{12}$ address buffer 58. When memory 2 functions in a 64k-bit configuration, pull-down transistors 78 and 80 are both non-conductive and the $A_{12}$ address buffer 58 continues to supply the address and inverted address indicators $AI_{12}$, $\overline{AI}_{12}$ necessary to 64k-bit operation. If, on the other hand, either one or the other of pull-down transistors 78 and 80 is permanently biased into conduction, the output from the corresponding inverter 64 or 66 is grounded and the address and inverted address indicators $AI_{12}$, $\overline{AI}_{12}$ are locked into complementary high and low values which partition primary array 6 into the aforementioned operative 32k-bit configuration. In particular, when pull-down transistor 78 is rendered permanently conductive, the output of inverter 64 is permanently grounded and address indicator $AI_{12}$ assumes a high value while inverted address indicator $\overline{AI}_{12}$ is driven low. All primary array storage devices 4 characterized by an address having a "zero" $A_{12}$ address bit are subsequently disabled while those storage devices in primary array 6 having addresses with a "one" $A_{12}$ address bit may or may not be enabled depending upon the values of the remaining $A_0$–$A_{11}$ address bits. Alternatively, where pulldown transistor 80 is rendered permanently conductive, the output of inverter 66 is permanently grounded and address indicator $AI_{12}$ is locked low while inverted address indicator $\overline{AI}_{12}$ is locked high, in turn permanently disabling all storage devices having addresses with a "one" $A_{12}$ address bit and permitting all storage devices having addresses with a "zero" $A_{12}$ address bit to be activated in accordance with the status of the remaining $A_0$–$A_{11}$ address bits.

Pull-down transistors 78 and 80 may be respectively programmed through the use of pull-down circuits 82 and 84. As can be seen in FIG. 3, pull-down circuit 82 includes a fusible link 86 such as a polysilicon fuse connected between ground and the control lead 88 tied to control gate 90 of pull-down transistor 78. The control gate 90 of pull-down transistor 78 is thus normally grounded to render pull-down transistor 78 non-conductive. In contrast, when it is desired to partition primary array 6, fusible link 86 is blown. A zero threshold voltage device 92 and a depletion-mode device 94 connected in pull-up configuration between a voltage supply line 96 and control lead 88 then operate to raise the voltage of control lead 88 and gate pull-down transistor 78 into conduction. The actual blowing of fusible link 86 is accomplished by activating a fuse-blowing circuit 98 in pull-down circuit 82. Fuse-blowing circuit 98 comprises a fuse-blowing transistor 100 connected between a high voltage supply line 102 and control lead 88. At least one of three enhancement-mode pull-down transistors 104, 106 and 108 connected to the control gate 110 of the fuse-blowing transistor normally conducts to ground control gate 110 and shut the fuse-blowing transistor off. However, fuse-blowing transistor 100 can also be biased into conduction by a depletion-mode device 112 connected between high voltage supply line 102 and control gate 110. To this end, the control gates of pull-down transistors 104–108 are connected to receive a series of control signals from the dual-function address buffers of memory 2. Specifically, the control gate of pull-down transistor 104 receives the control signal $RA_{12}$ from the $A_{12}$ address buffer, the control gate of pull-down transistor 106 receives the control signal $RA_6$ from the $A_6$ address buffer and the control gate of pull-down transistor 108 receives the inverted control signal $\overline{RA}_0$ from the $A_0$ address buffer. During normal operation of memory 2, the TTL voltages on the address bit inputs 16 to the various address buffers 18 are such that control signals $RA_6$ and $RA_{12}$ both remain high, biasing pull-down transistors 104 and 106 into conduction and grounding control gate 110 of fuse-blowing transistor 100 as previously indicated. When pull-down transistor 78 is to be programmed, a 15 volt signal is supplied to the $A_6$ and $A_{12}$ address bit inputs 16 associated with the $A_6$ and $A_{12}$ address buffers 18 while the $A_0$ address bit input associated with the $A_0$ address buffer receives no signal. The high voltage detectors in the $A_6$ and $A_{12}$ address buffers respectively output low control signals $RA_6$ and $RA_{12}$ as taught in connection with FIG. 2 hereinabove. The absence of a voltage signal on the $A_0$ address bit input yields a low inverted control signal $\overline{RA}_0$. The low control signals $RA_6$ and $RA_{12}$ render pull-down transistors 106 and 104 non-conductive, removing two of the three paths between control gate 110 of fuse-blowing transistor 100 and ground. Similarly, the low inverted control signal $\overline{RA}_0$ renders pull-down transistor 108 in the fuse-blowing circuit non-conductive to remove the remaining ground from control gate 110 of fuse-blowing transistor 100. A high voltage (e.g., 20 v.) pulse train is next applied to high voltage supply line 102, whereupon the operation of depletion-mode device 112 connected to control gate 110 periodically biases the fuse-blowing transistor 100 into conduction. Large current pulses are consequently generated along the direct current path now established from the high voltage supply line 102 through the polysilicon fuse 86 to ground. As a result, polysilicon fuse 86 is blown to remove the ground from control lead 88 of pull-down transistor 78. The combined action of zero threshold voltage device 92 and depletion-mode device 94 thereafter raises the voltage on control lead 88 sufficiently to gate pull-down transistor 78 into conduction, permanently grounding the output of inverter 64 to lock in a high value for address indicator $AI_{12}$ and a low value for inverted address indicator $\overline{AI}_{12}$. All storage devices 4 in primary array 6 having an address characterized by a "zero" $A_{12}$ address bit are thus permanently disabled to effectively partition primary array 6 and produce a functioning 32k-bit memory.

Programming of pull-down transistor 80 for the purpose of permanently grounding the output of inverter 66 and locking the address and inverted address indicators $AI_{12}$, $\overline{AI}_{12}$ respectively into low and high values is accomplished by activating pull-down circuit 84. Pull-down circuit 84 operates in a manner analogous to pull-down circuit 82. Accordingly, a grounded fusible link 114 such as a polysilicon fuse connected via control lead 116 to the control gate 118 of pull-down transistor 80 renders pull-down transistor 80 normally non-conductive. Zero voltage threshold device 120 and depletion-mode device 122 connected in pull-up configuration between voltage supply line 124 and control lead 116 serve to gate pull-down transistor 80 into conduction when polysilicon fuse 114 is blown. Pull-down circuit 84 includes a fuse-blowing circuit 126 comprising a fuse-blowing transistor 128 having a control gate 130 tied to high voltage supply line 132 via depletion-mode device 134 and simultaneously tied to ground through pull-down transistors 136, 138 and 140. As with fuse-blowing circuit 98 in pull-down circuit 82, the control gates of pull-down transistors 136 and 140 are respectively connected to receive the control signal $RA_{12}$ from the $A_{12}$ address buffer and the inverted control signal $\overline{RA}_0$ from the $A_0$ address buffer. In contrast to fuse-blowing circuit 98, the control gate of pull-down transistor 106 receives the control signal $RA_7$ from the $A_7$ address buffer. Hence, when programming pull-down transistor 80 high voltage signals are applied to the $A_7$ and $A_{12}$ address bit inputs 16 while the $A_0$ address bit input remains in a low state. The ground paths through pull-down transistors 136–140 are subsequently removed from the control gate 130 of fuse-blowing transistor 128 and high voltage pulses are applied to high voltage supply line 132 to blow polysilicon fuse 114. With polysilicon fuse 114 blown, pull-down transistor 80 is permanently biased into conduction by the operation of zero threshold voltage device 120 and depletion-mode device 122, to permanently ground the output of inverter 66. The low address indicator $AI_{12}$ and high inverted address indicator $\overline{AI}_{12}$ so obtained from the $A_{12}$ address buffer act to effectively disable every storage device 4 in primary array 6 having an address characterized by a "one" $A_{12}$ address bit. Again, it can be seen that primary array 6 is partitioned to yield a 32k-bit memory.

The present invention has been set forth in the form of one preferred embodiment. It is nevertheless intended that modifications to the circuit configuration disclosed herein may be made by those skilled in the art without departing from the scope and spirit of the present invention. Moreover, such modifications are considered to be within the purview of the appended claims.

We claim:

1. A circuit structure for electrically partitioning an array of semiconductor storage devices in order to isolate defective storage devices present in the array, said circuit structure comprising:
   a series of address buffer means connected to the array for respectively receiving the address bits of an address signal and for respectively generating a series of output signals which together serve to access and enable an individual storage device in accordance with the values of the address bits; and
   circuit means for locking the output signals from a selected one of said address buffer means into one of two permanent states when the array is to be partitioned.

2. A circuit structure as set forth in claim 1, wherein each of said address buffer means includes a pair of inverters connected to receive one of the address bits of the address signal and said circuit means includes first and second programmable pull-down means respectively connected to the outputs of the pair of inverters in said selected one of said address buffer means for grounding one of said outputs of said pair of inverters in said selected one of said address buffer means when the array is to be partitioned.

3. A circuit structure as set forth in claim 2, wherein each of said first and second programmable pull-down means includes a gating means for connecting the output of the inverter associated therewith to ground.

4. A circuit structure as set forth in claim 3, wherein said gating means is a pull-down transistor connected between said output of said inverter associated therewith and ground, said pull-down transistor having a control gate connected to a pull-down circuit which normally renders said pull-down transistor non-conductive but which can be programmed to gate said pull-down transistor into conduction.

5. A circuit structure as set forth in claim 4, wherein said pull-down circuit includes a fusible link connected between ground and said control gate of said pull-down transistor and a pull-up transistor circuit connected between a voltage supply and said control gate of said pull-down transistor.

6. A circuit structure as set forth in claim 5, wherein said pull-down circuit further includes a fuse-blowing circuit means for blowing said fusible link when said pull-down transistor is to be gated into conduction.

7. A circuit structure as set forth in claim 6, wherein said fuse-blowing circuit includes a fuse-blowing transistor connected between a high voltage source and said fusible link, said fuse-blowing transistor having a control gate.

8. A circuit structure as set forth in claim 7, wherein said fuse-blowing circuit further includes a depletion-mode device connected between said control gate of said fuse-blowing transistor and a source of high voltage and at least one enhancement-mode device connected between said control gate of said fuse-blowing transistor and ground.

9. A circuit structure as set forth in claim 8, wherein said enhancement-mode device includes a control gate connected to receive a control signal for rendering said enhancement-mode device non-conductive.

10. A circuit structure as set forth in claim 1, wherein said output signals generated by said series of address buffer means respectively comprise sets of complimentary logic signals and said circuit means operates to lock the set of complimentary logic signals generated by said selected one of said address buffer means into said one of two permanent states, each of said two permanent states being characterized by two complimentary logic values respectively associated with the members of said set of complimentary logic signals generated by said selected one of said address buffer means.

11. In a semiconductor memory having an array of storage devices together with a series of address buffers which respectively receive the address bits of an address signal and which subsequently generate output signals for use in accessing and enabling an individual storage device in accordance with the values of the address bits, the improvement comprising:
    circuit means for locking the output signals from a selected one of the address buffers into one of two permanent states such that all storage devices having a common value for the address bit associated with the selected address buffer are electrically isolated and effectively removed from the semiconductor memory.

12. A method for electrically isolating defective storage devices present in a semiconductor memory having an array of storage devices together with a series of address buffers which respectively receive the address bits of an address signal and which subsequently generate output signals for use in accessing and enabling an individual storage device in accordance with the values of the address bits, said method comprising the steps of:
    identifying an address bit having a common value for substantially all of the defective storage devices;
    selecting the address buffer associated with said address bit so identified; and
    locking the output signals from said address buffer so selected into one of two permanent states such that all storage devices having said common value for said address bit so identified are electrically isolated and effectively removed from the semiconductor memory.

* * * * *